(12) United States Patent  
Burgess et al.

(10) Patent No.: US 7,732,307 B2  
(45) Date of Patent: Jun. 8, 2010

(54) METHOD OF FORMING AMORPHOUS TiN BY THERMAL CHEMICAL VAPOR DEPOSITION (CVD)

(75) Inventors: Stephen Robert Burgess, Gwent (GB); Andrew Price, Cardiff (GB); Nicholas Rimmer, Cardiff (GB); John MacNeil, Cardiff (GB)

(73) Assignee: Aviza Technology Limited, Newport, Gwent (GB)

( * ) Notice: Subject to any disclaimer, the term of this patent is extended or adjusted under 35 U.S.C. 154(b) by 0 days.

(21) Appl. No.: 11/143,953

(22) Filed: Jun. 3, 2005

(65) Prior Publication Data  
US 2005/0275101 A1 Dec. 15, 2005

Related U.S. Application Data

(60) Provisional application No. 60/588,374, filed on Jul. 16, 2004, provisional application No. 60/622,678, filed on Oct. 28, 2004.

(30) Foreign Application Priority Data  
Jun. 14, 2004 (GB) ................... 0413281.7

(51) Int. Cl.  
*H01L 21/20* (2006.01)  
(52) U.S. Cl. .............. 438/482; 438/680; 257/915; 257/E21.17  
(58) Field of Classification Search ............. 438/482, 438/680; 257/915, E21.17  
See application file for complete search history.

(56) References Cited

U.S. PATENT DOCUMENTS 5,659,057 A * 8/1997 Vaartstra ................. 556/51  
B736,192 I5 4/1998 Okamoto  
5,770,520 A 6/1998 Zhao et al.  
5,837,056 A * 11/1998 Kikkawa ................. 117/84  
6,103,566 A * 8/2000 Tamaru et al. ............. 438/240  
6,495,461 B2 12/2002 Tsubouchi et al.

(Continued)

FOREIGN PATENT DOCUMENTS

EP 854505 A2 * 7/1998

OTHER PUBLICATIONS

Reid et al., Ti-Si-N. Diffusion Barriers Between Silicon and Copper, IEEE Electron Device Letters, vol. 15, No. 8, Aug. 1994, pp. 298-300.

*Primary Examiner*—Thanh V Pham  
(74) *Attorney, Agent, or Firm*—Volentine & Whitt, PLLC

(57) ABSTRACT

A modified TDEAT (tetrakisdiethylamino titanium) based MOCVD precursor for deposition of thin amorphous TiN:Si diffusion barrier layers. The TDEAT is doped with 10 at % Si using TDMAS (trisdimethlyaminosilane); the two liquids are found to form a stable solution when mixed together. Deposition occurs via pyrolysis of the vaporised precursor and $NH_3$ on a heated substrate surface. Experimental results show that we have modified the precursor in such a way to reduce gas phase component of the deposition when compared to the unmodified TDEAT-NH3 reaction. Deposition temperatures were the range of 250-450° C. and under a range of process conditions the modified precursor shows improvements in coating conformality, a reduction in resistivity and an amorphous structure, as shown by TEM and XRD analysis. SIMS and scanning AES have shown that the film is essentially stoichiometric in Ti:N ratio and contains low levels of C (~0.4 at %) and trace levels of incorporated Si (0.01<Si<0.5 at %).

17 Claims, 7 Drawing Sheets

U.S. PATENT DOCUMENTS 6,576,543 B2 6/2003 Lin et al.
2004/0197492 A1* 10/2004 Chen et al. ................. 427/569
2004/0248397 A1* 12/2004 Seo et al. .................... 438/627

* cited by examiner

METHOD OF FORMING AMORPHOUS TiN BY THERMAL CHEMICAL VAPOR DEPOSITION (CVD)

CROSS REFERENCE TO RELATED APPLICATIONS

A claim to priority is made to U.S. Provisional Applications Nos. 60/588,374 filed Jul. 16, 2004 and 60/622,678 filed Oct. 28, 2004 and to British Patent Application No. 0413281.7 filed Jun. 14, 2004.

BACKGROUND OF INVENTION

1. Field of the Invention

This invention relates to barrier layers.

2. Background of the Invention

The introduction of CVD metal diffusion barriers into mainstream Back End of Line semiconductor manufacture is becoming increasingly more common. Due to the continued shrinking of device feature sizes traditional PVD techniques such as long throw and collimated sputtering have been superseded by ionised sputtering techniques that offer impressive increases in bottom coverage. However, for Cu metallisation a very thin but effective barrier material is needed in contact with the interlayer dielectric (ILD) to prevent Cu diffusion and so the conformality of deposition is paramount. Atomic layer CVD (ALCVD) offers seemingly perfect conformality and high purity layers with good diffusion barrier properties. Use of ALCVD technology as a diffusion barrier is however not without its problems; high resistivity materials, low deposition rates and ALCVD's sensitivity to surface conditions are some of the issues currently under investigation. Metal organic CVD (MOCVD) is seen as a promising technology due to its higher deposition rate, good conformality and relatively low process temperatures but has the difficulty in meeting the challenge of producing a robust low resistivity barrier to Cu diffusion.

Significant efforts have been made to develop metal organic (MO) precursors for the MOCVD of both TiN and TaN, materials with good adhesion to ILDs and excellent diffusion barrier characteristics to Cu. Thin films deposited from such precursors systems however have been found to have high resistivity, mainly due to the incorporation of large amounts of C and H within the growing film. Poor conformality due to significant gas phase reaction can also be a drawback.

So-called "amorphous TiN" has been reported in the literature, but, as discussed in more detail below, all known examples contain crystallites. For many uses of bulk materials, the presence of these crystallites may be irrelevant. However, as indicated above, barrier layers for ILD are extremely thin and are approximately the same thickness as the dimensions of the crystallites. The presence of such crystallites would therefore prevent such materials forming effective barrier layers and these materials have therefore been discounted for this use.

SUMMARY OF THE INVENTION

The Applicants, however, have appreciated that a truly amorphous TiN layer (i.e. one without crystallites) would be highly suitable for a thin barrier layer.

From one aspect the invention consists in a layer of truly amorphous TiN having a thickness of 10 nanometres or less that is a barrier to metal diffusion.

The TiN may be formed from a Si-containing precursor and the layer may contain Si. In a more general approach the TiN may contain a lattice disrupting component to provide the amorphous nature of the layer.

From another aspect the invention consists in a method of forming a barrier layer comprising chemical vapour deposition (CVD) of TiN from at least one silicon-containing compound and a titanium-containing compound and nitrogen or a nitrogen-containing compound.

The titanium-containing compound may be tetrakisdietylamininotitanium (TDEAT). The silicon-containing compound may be tris(dimethylamino)silane (TDMAS). The silicon- to Titanium ratio in the precursors may be in the range 5:95 to 15:85. In one preferred embodiment the silicon to titanium ratio may be about 10:90.

The CVD may occur via pyrolysis of a vapourised precursor and $NH_3$ on a heated substrate. The substrate may be heated to about 400° C. The flow rate of $NH_3$ may be about 250 sccm.

The layer may be subjected to post deposition plasma treatment. The plasma treatment may use hydrogen, nitrogen or hydrogen/nitrogen in a plasma.

Any of the above methods may be used to form truly amorphous TiN layers for other purposes and such methods are also included within the invention as are layers of such materials.

As indicated above the TDEAT precursor and the TDMAS precursor may be combined to form a single stable hybrid liquid precursor. The Applicants set out the results of low pressure CVD of TiN:Si from the TDEAT/TDMAS-$NH_3$ via a full material characterisation using SEM, TEM, XRD, AES, SIMS and resistivity measurements.

Although the invention has been described above it will be appreciated that it includes any inventive combination of the features set out above or in the following description.

BRIEF DESCRIPTION OF THE DRAWINGS

The invention may be performed in various ways and specific embodiments will now be described, by way of example, with reference to the accompanying drawings in which.

DETAILED DESCRIPTION OF THE PREFERRED EMBODIMENTS

The MOCVD reactor used for the work here is a based on a Trikon Technologies Planar 200 CVD chamber. Reactants are introduced via a dual port (duplex) showerhead of 20 cm diameter at about 25 mm above the wafer surface. The duplex showerhead design allows separate and uniform introduction of the reacting species (modified metal organic precursor and NH3 in this case) across the wafer surface, thus minimising any premixing and preventing any undesirable reactions within the showerhead itself. The shower head is also RF driven at 13.56 MHz allowing diode discharges to be set up between the wafer surface and showerhead. The load locked reactor is fitted with a variable temperature (room temperature to 650° C.) 200 mm platen on which the substrate rests.

The TDEAT TDMAS precursor mix with silicon to titanium ratio of 10:90 at % was obtained from Epichem Ltd and the TDEAT from Schumacher. Due the low vapour pressure of the precursors (TDEAT Vp=0.2 Torr at 90° C.) and the relatively low decomposition temperature of metal organics (~120° C. for TDEAT) it was necessary to use a direct liquid injection (DLI) system to obtain a sufficiently high flow of precursor vapour. For the work here a MKS DLI system was used. The precursor was vaporised in a multi-plate vaporiser and helium carrier gas was used to transport the vapour, via temperature controlled pipework, to the showerhead and chamber assembly.

Figure 1:
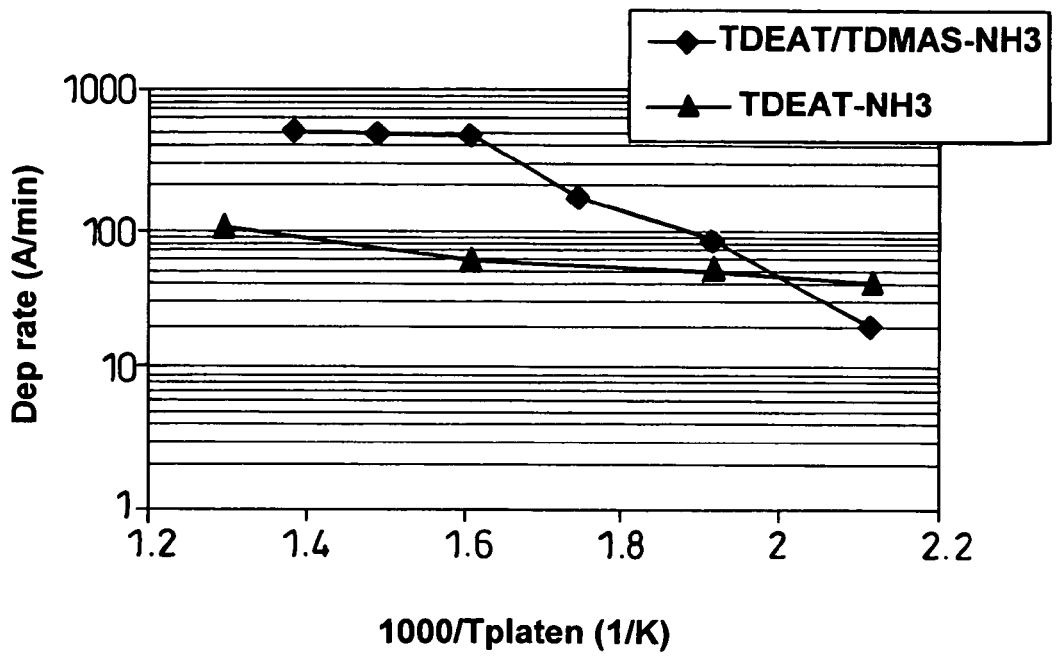
FIG. 1 is an Arrhenius plot of TDEAT-$NH_3$ and TDEAT/TDMAS-$NH_3$ reactions.

FIG. 1. shows the deposition rate as a function of reciprocal deposition temperature (indicated platen temperature) for TDEAT/NH₃ and the hybrid TDEAT-TDMAS/NH₃ precursors. In each case the liquid pump rate into the vaporiser unit was 0.1 cc/min. The vaporiser plates were set at 90° C., which provides into a vapour flow of ~4 sccm for TDEAT. The chamber pressure was 4 Torr in both cases. For TDEAT-NH₃ it can be seen that a small dependency of deposition rate on temperature is observed, deposition rate decreases as temperature decreases. The slope gives an activation energy of Ea~0.1 eV, which is in good agreement with other low pressure CVD studies of this precursor system. Such a low activation energy is indicative of a significant gas phase component present in the reaction; this component can have a large bearing on the deposition characteristics. Deposition of TiN from TDEAT/NH₃ is generally accepted to proceed via a multi step 'transamination' reaction. The first step being a reversible transamination reaction to form a transient intermediate in the gas phase, (NEt₂)₃Ti—NH₂ with a corresponding amine group (HNEt₂) being formed.

The presence of gas phase reactions effectively converts the MO precursors into a new Ti containing molecule (the transient intermediate) prior to reacting with NH₃ at the coating surface to form TiN(C).

The reaction rate of the TDMAT/NH₃ reaction (heavily gas phase driven due to the smaller methyl group in the TDMAS molecule) is strongly inhibited by the extra addition of dimethylamine HNMe₂ (DMA) in the reactor, confirming the idea of a reversible transamination reaction and also suggesting that additional amine containing molecules could be used to control gas phase reactions and thus modify the resulting TiN film properties. Reducing the gas phase reaction component can result in an improvement in step coverage, improved film properties such as increased density and decreased resistivity and reduced particle levels.

For the TDEAT-TDMAS/NH₃ reaction the reaction rate shows two distinct regions. At higher temperatures little or no dependency on temperature is observed, consistent with a mass transport limited reaction. At lower temperatures (platen temperature <420° C.) a much larger dependency on temperature is observed. The activation energy derived from this region is Ea~0.5 eV. Activation energies in the range 0.5-1.0 eV are consistent with a surface driven reaction. Thus it appears that the addition of the silicon containing amine molecule TDMAS has suppressed a significant amount of the gas phase component to the standard TDEAT/NH₃ reaction, making the reaction more surface driven.

Figure 2:
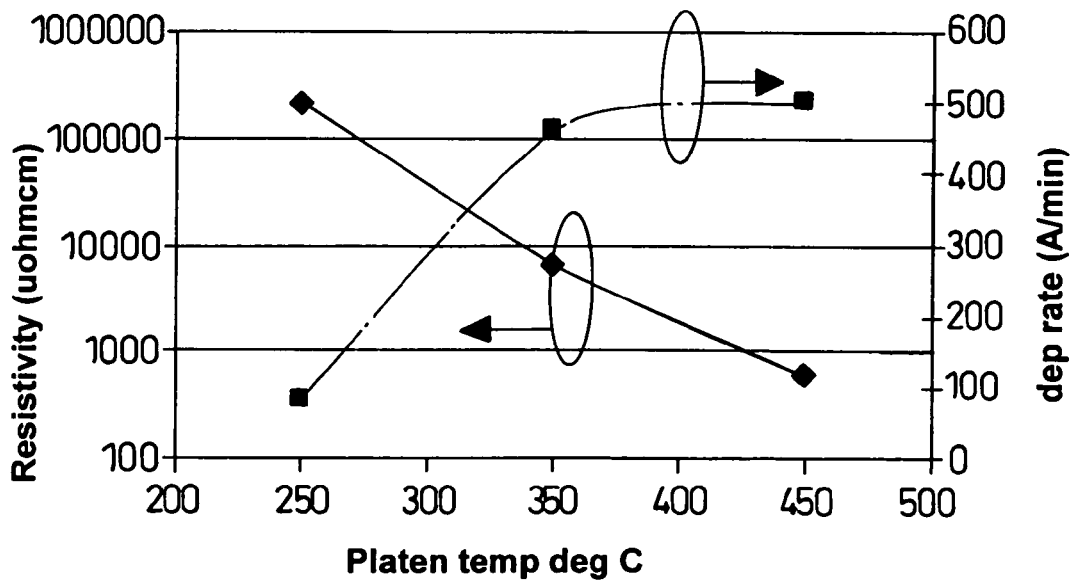
FIG. 2 shows results from a TDEAT/TDMAS-$NH_3$ reaction. Resistivity and deposition rate are given as a function of platen temperature.
Figure 3:
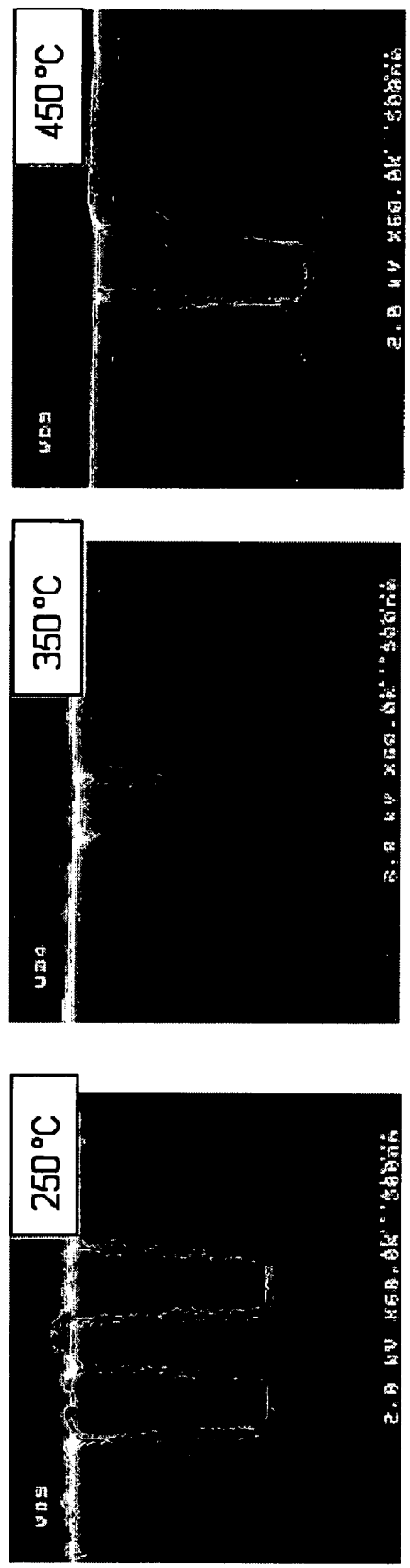
FIG. 3 are SEM images showing of step coverage of film deposition in 3:1 AR aspect ratio 0.25 μm, contact structures formed in oxide contacting Si. Conditions: 500 sccm $NH_3$, 4 Torr chamber pressure.

FIG. 2 shows the resistivity and deposition rate as a function of platen temperature for TDEAT-TDMAS/NH₃ reaction. NH₃ flow was 500 sccm and chamber pressure was 4 Torr. A large dependence on platen temperature is observed, with higher temperature giving lower resistivity films. This is consistent with previous studies of films deposited with Ti alkylamines and is reported to be a function of film density and impurity concentration. FIG. 3 shows the step coverage for 250, 350 and 450° C. depositions. As the deposition temperature decreases the step coverage increases, a well known trend for CVD coating reactions. Step coverage is essentially conformal (~80% step coverage) at 250° C. However, reference to FIG. 2. shows an as deposited resistivity of ~100,000 μohmcm, which is around 2 orders too high for this type of application. Higher temperatures give less conformal films, 450° C. gives around 35% step coverage and 800 μohmcm.

Figure 4:
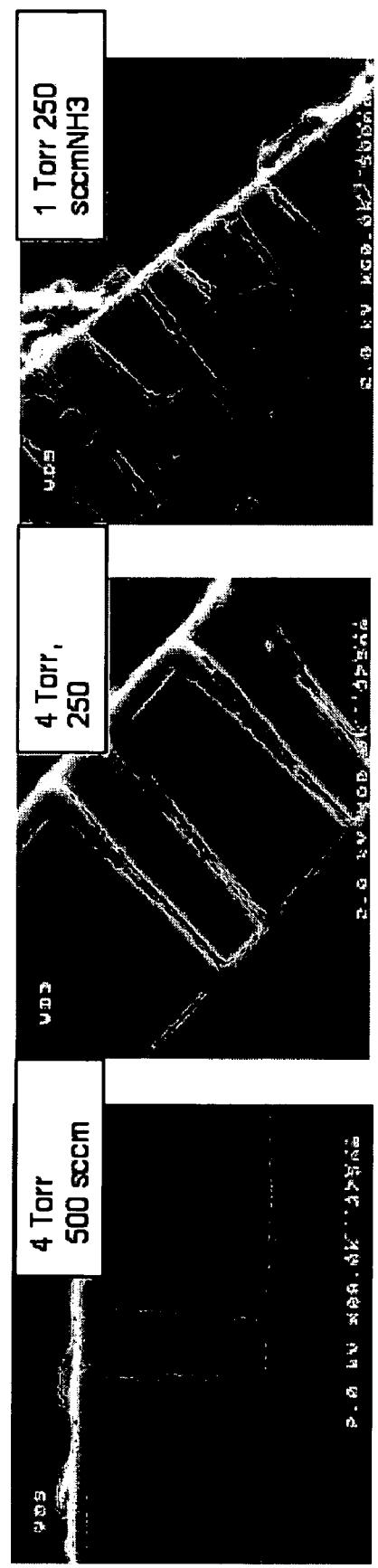
FIG. 4 are SEM showing images of step coverage of film deposition in 3:1 aspect ratio 0.25 μm contact structures formed in oxide contacting Si. Conditions: 250 sccm $NH_3$, platen temperature 400° C. Surface contamination visible in the 1 Torr image is due to an HF dip process.

The behaviour of the deposition rate at 400° C. (673°) platen temperature as shown in FIGS. 1 and 2 indicates a change in the deposition mode from mass transport limited to surface reaction rate limited. Table 1 gives film resistivity and step coverage details for depositions at 400° C. platen temperature for 4 and 1 Torr pressures and 500/250 sccm of NH₃ flow (processes labelled A to C). The table shows that high NH₃ flows give the lowest resistivity but poor step coverage. Reducing the NH₃ flow improves coverage at the expense of resistivity (process B). FIG. 4. shows SEM images for A to C showing around 90% step coverage for the 1 Torr depositions (C) although deposited film resistivity is ~3000 μohmcm. Table 2 compares an optimised (trade off between conformality and film resistivity) process O (POR) for the TDEAT/NH₃ reaction with process B and C described above. Process B shows a small decrease (−10%) in resistivity but an improved step coverage (75% relative improvement) compared to the TDEAT-NH₃ POR result.

TABLE 1

Process parameters and basic film properties for TDEAT/TDMAS precursor. Step coverage measured in 0.25 μm 3:1 aspect ratio via.

| Parameter | A | B | C |
|---|---|---|---|
| Pressure Torr | 4 | 4 | 1 |
| NH₃ flow sccm | 500 | 250 | 250 |
| Platen temp ° C. | 400 | 400 | 400 |

TABLE 1-continued

Process parameters and basic film properties for TDEAT/TDMAS precursor. Step coverage measured in 0.25 μm 3:1 aspect ratio via.

| Parameter | A | B | C |
|---|---|---|---|
| Resistivity uohmcm | 900 | 2000 | 3000 |
| Step coverage % | 30 | 70 | 90 |

TABLE 2

Comparison of TDEAT process O with TDEAT/TDMAS process B and C deposited at 400° C. Step coverage measured in 0.25 μm 3:1 aspect ratio via.

| Parameter | O | B | C |
|---|---|---|---|
| Pressure Torr | 4 | 4 | 1 |
| NH$_3$ flow sccm | 500 | 250 | 250 |
| Platen temp ° C. | 350 | 400 | 400 |
| resistivity uohmcm | 2200 | 2000 | 3000 |
| Step coverage % | 40 | 70 | 90 |

Figure 5:
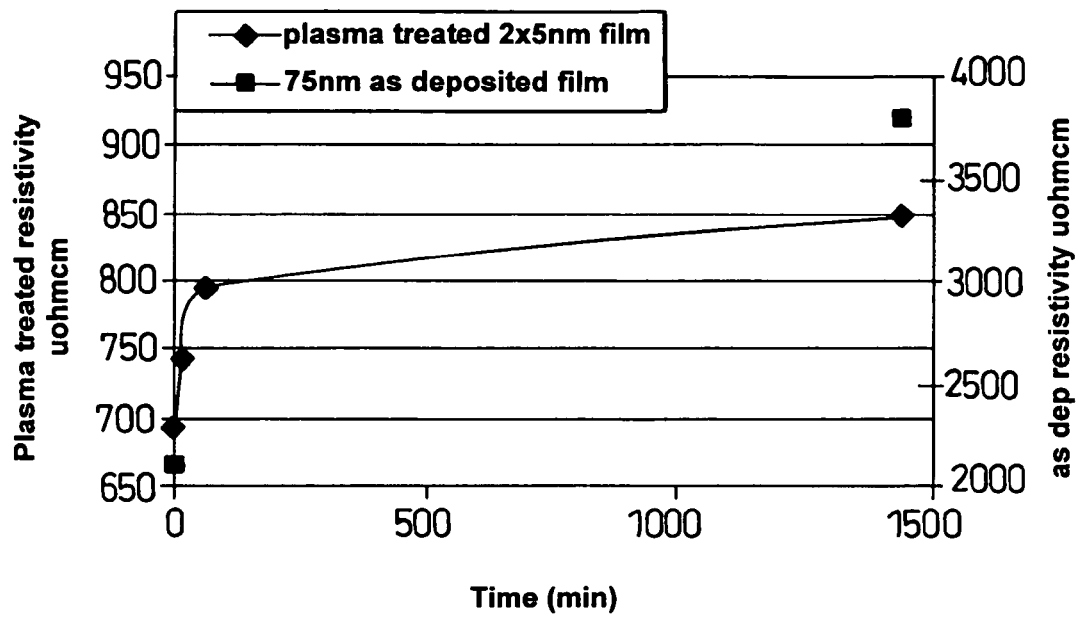
FIG. 5 shows the resistivity of TDEAT/TDMAS-$NH_3$ reaction on air exposure for "as deposited" and "plasma treated films". Conditions: 400° C. platen temperatures, 250 sccm $NH_3$, 4 Torr. 2×5 nm film is 5 nm followed by plasma treatment repeated twice to form a total thickness of 10 nm.

The effect of in-situ H$_2$/N$_2$ plasma treatments on the resistivity of thin (2×5 nm) films has also been investigated. FIG. 5 shows the results of plasma treated and non-treated films, and the effect of air exposure on resistivity. Process B was used for this work. It can be seen that the plasma treated film shows a distinct reduction in resistivity to around 700 μohmcm (as deposited ~2000 μohmcm) which rises to 850 μohmcm (+18%) after 24 hours air exposure. The non plasma treated film rises from 2100 to 3800 μohmcm over the 24 hour period (80%). The reduction in resistivity and increase in stability of TiN is well know for TDMAT/N$_2$ and TDEAT/NH$_3$ reactions and is due to the passivation of any non nitrided Ti present at the grain boundaries. For the TDEAT/NH$_3$ process O, which has a higher starting resistivity of around 2200 μohmcm, a post plasma treated resistivity of 300 μohmcm is observed, about half of that of TDEAT-TDMAS/NH$_3$. It is worth noting however that resistivities of the order of 1000 μohmcm are still favourable for Cu barriers, especially when compared to MOCVD and ALD TaN processes which typically have resistivites that are several times this value.

Figure 6:
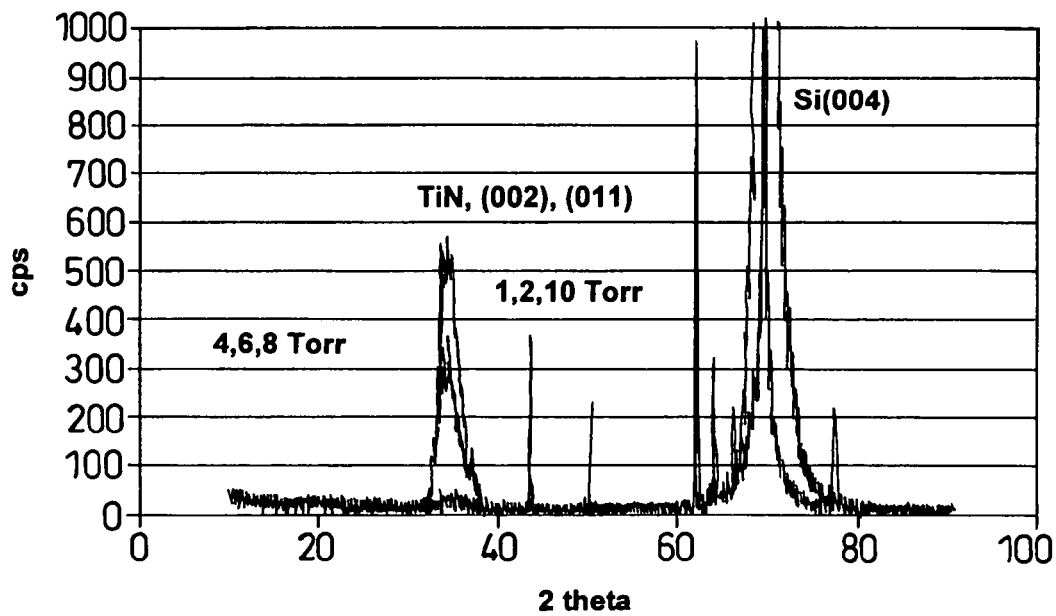
FIG. 6 shows 2 theta XRD scans of 50 nm films as a function of chamber pressure. X-ray amorphous films are observed between 4-8 Torr. Conditions: 400° C., 250 sccm $NH_3$, chamber pressure 1-10 Torr.

FIG. 6 shows theta/2theta XRD plots for TDMAS/TDEAT-NH$_3$ deposited at 400° C. platen temperature and 250 sccm NH$_3$ (500 sccm He carrier gas) as a function of chamber pressure. The plot shows a distinct process window between 4-8 Torr chamber pressure where the TiN diffraction peak (possibly a combination of 002 and 011 diffraction peaks) is reduced to trace levels, that is the deposit appears at least X-ray amorphous. 'X-ray amorphous' means that the material may still be crystalline, but the degree of ordering is extremely small. For chamber pressures either side of this range (1, 2 and 10 Torr) the XRD trace is consistent with a textured nanocrystalline deposit.

Figure 7:
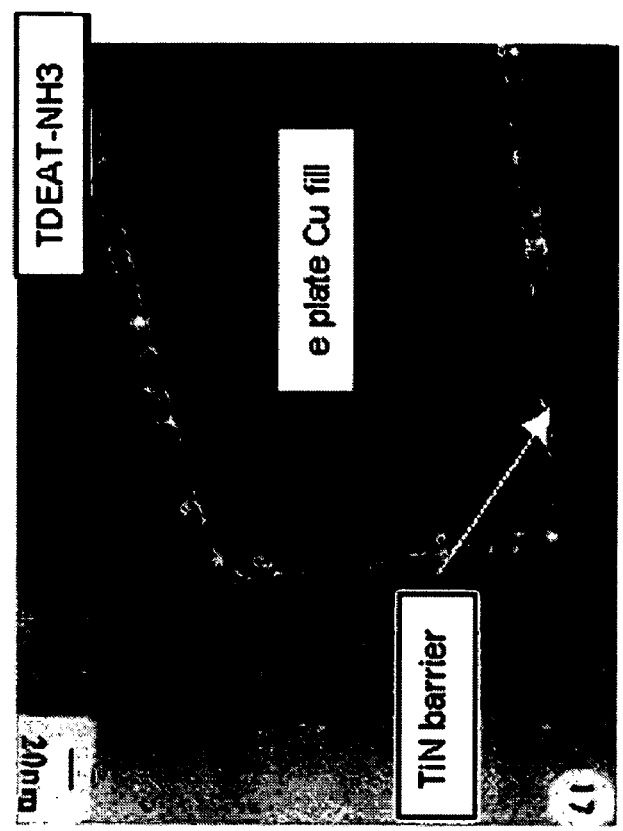
FIG. 7 shows dark field TEM images of TiN:Si barriers deposited into Orion 2.2 Low K oxide single damascene structures. Lack of contrast for the TDEAT/TDMAS-NH₃ barrier layer confirms a truly amorphous structure.
Figure 7:
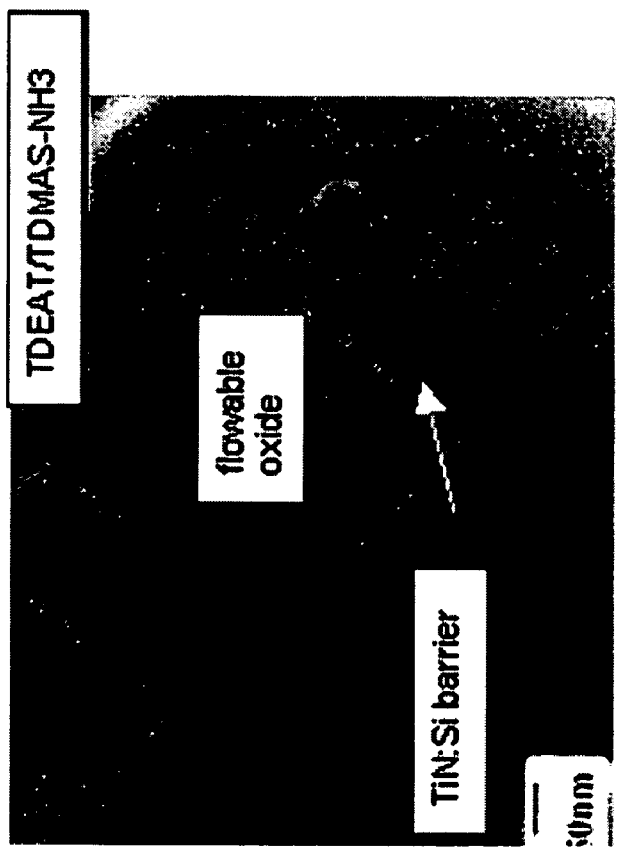

To fully confirm the microstructure we have deposited TiN:Si layers onto single damascene structures etched in porous low K (Orion 2.2) oxide. FIG. 7 left is a dark field TEM image of the barrier deposited at 4 Torr (process B in table 1). The bright conformal coating is the TiN:Si barrier in this case. The structure has been filled with flowable oxide to aid contrast. The lack of contrast within the barrier layer confirms that the film is fully amorphous in structure. Other reports of 'amorphous TiN' have usually concluded in small crystallites present in an amorphous matrix. No crystallites were detected in any area of the amorphous samples analysed here. The amorphous structure may well show good diffusion barrier characteristics to Cu. Also shown is a dark field image (FIG. 7 right) for the TDEAT-NH3 reaction, the contrast between differently orientated crystallites (bright spots) can be clearly seen confirming its nanocrystalline structure.

Figure 8:
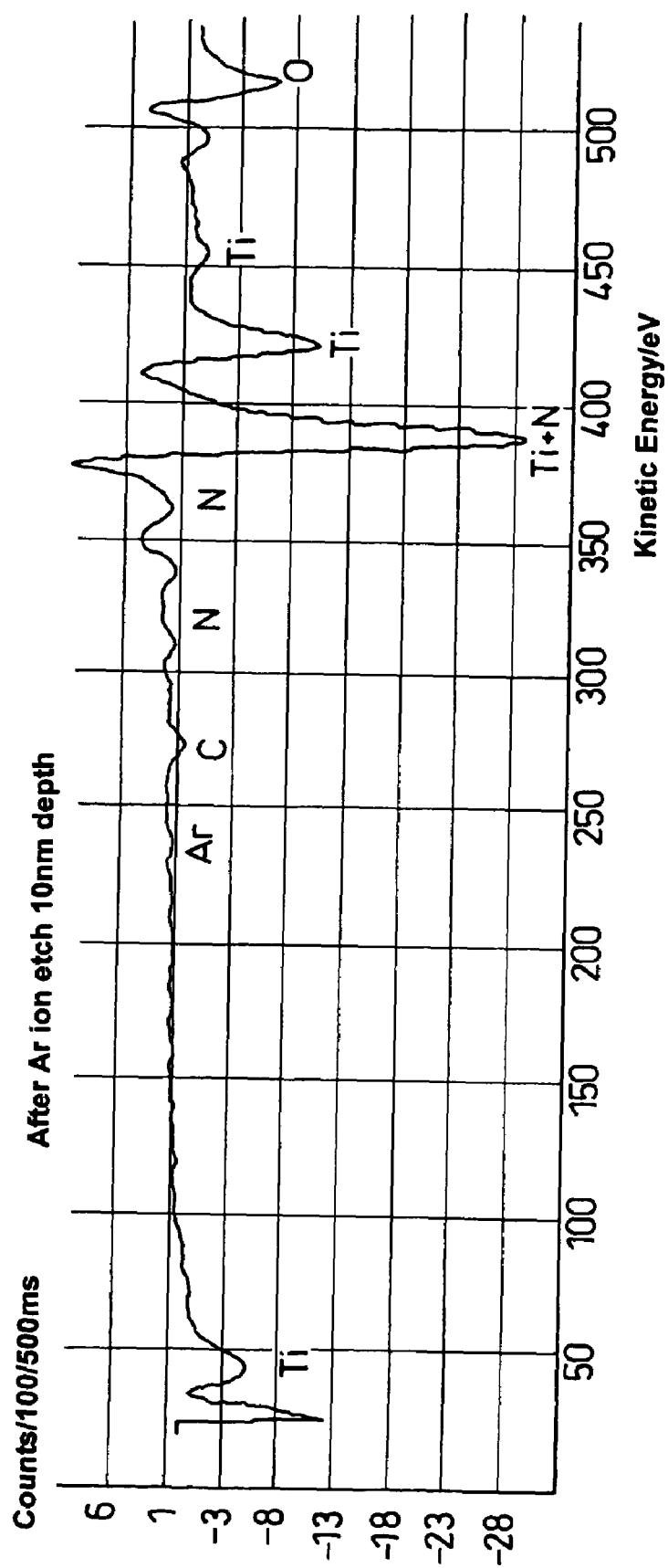
FIG. 8 shows an Auger electron scan of 50 nm amorphous TiN:Si from process B. Scan taken after 10 nm Ar ion etch into sample. (400° C., 250 sccm NH₃, 4 Torr). No Si is detected (90-100 eV region), small amounts of C (~0.4 at %), 16% O and Ti:N ratio of ~1. Error +−10% on at %.

Both scanning Auger electron spectroscopy (AES) and secondary ion mass spectroscopy (SIMS) have been used to determine the film composition. FIG. 8 shows a differential AES scan after 10 nm Ar ion etch into a 50 nm film deposited with process B conditions (amorphous structure, 4 T, 400° C., 250 sccm NH$_3$). An interesting observation here is that no low energy Si is detected (90-100 eV) suggesting <0.5 at % concentration and that low levels of are C present, ~0.4 at %. Oxygen levels are from atmospheric exposure. Table 3 below details at % concentration as determined from Auger line intensity measurements.

TABLE 3

AES compositional analysis of process B film after 10 nm Ar ion etch.

| Element | AES concentration at % |
|---|---|
| Ti | 41 |
| N | 42 |
| C | 0.4 |
| Si | <0.5 (lower limit for Si detection) |
| O | 16.6 |

Figure 9:
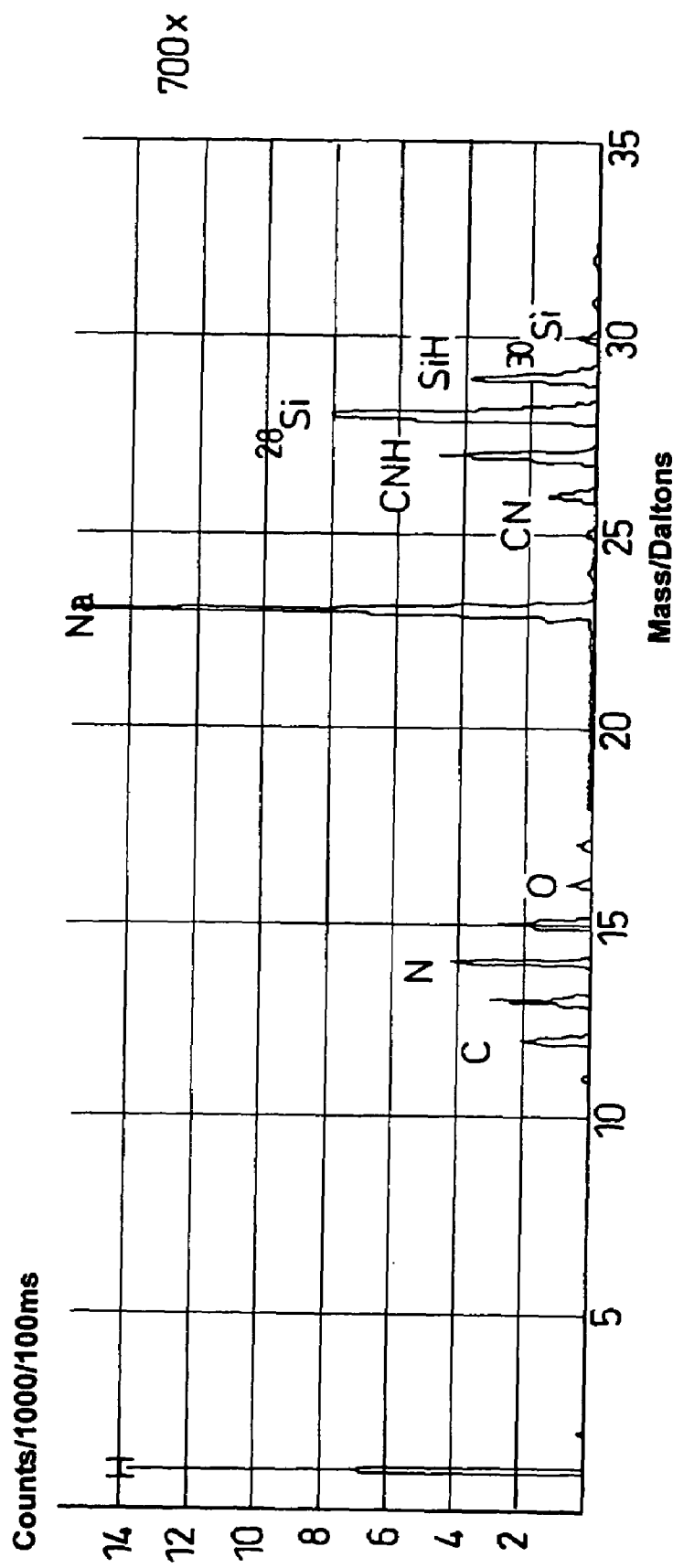
FIG. 9 shows a secondary ion mass spectroscopy (SIMS) scan of material from process B after 10 nm etch. High sensitivity of SIMS confirms presence of small amounts of Si within film. Si concentration >0.01%.

FIG. 9 is a SIMS scan of the same area. The labelled peaks confirm the presence of C and also of Si within the structure (28 and 30 Si isotopes in the correct ratio). Unfortunately no standard was available to be able to quantify the Si content in this case. However the Si signal was very weak when compared to the Ti bulk signal (1/1000) which when combined with the Auger result allows us to suggest an upper limit of Si concentration of <0.5 at % (Auger minimum detection levels). The lower limit for detection of Si with SIMS is ~0.01 at % which also defines a lower limit for Si levels.

Deposition of TiN:Si films from pyrolysis TDEAT/TDMAS-NH3 has resulted in an improved film properties when compare to the standard TDEAT-NH3 reactions. As deposited resistivity is lower with a significantly improved conformality (step coverage). We have also observed that for chamber pressures between 4 and 8 Torr the film microstructure is at least X-ray amorphous in nature. Dark field TEM of a 4 Torr process on structured wafers confirmed a fully amorphous material with no crystallites detected within the amorphous matrix. Compositional analysis has shown an essentially stoichiometric film with low C concentration (~0.4 at %). Si levels are 0.01<Si<0.5 at %.

What is claimed is:

1. A method of forming a barrier layer comprising thermal chemical vapour deposition (CVD) of amorphous TiN from silicon- and titanium-containing compounds and nitrogen or a nitrogen containing compound, wherein the titanium-containing compound is a metal organic compound, and wherein a silicon content in the amorphous TiN is less than 0.5 at. %.

2. A method as claimed in claim 1 wherein the titanium containing compound is silicon-containing tetrakisdiethylaminotitanium (TDEAT).

3. A method as claimed in claim 1 wherein the silicon to titanium atomic ratio of the silicon- and titanium-containing compounds is in the range 5:95 to 15:85.

4. A method as claimed in claim 3 wherein the silicon to titanium atomic ratio is about 10:90.

5. A method as claimed in claim 1 wherein the titanium containing compound is mixed with tris(di-methly-amino) silane (TDMAS).

6. A method as claimed in claim 1 wherein the CVD occurs via pyrolysis of vapourised precursor and $NH_3$ on a heated substrate surface.

7. A method as claimed in claim 6 wherein the substrate is heated to about 400° C.

8. A method as claimed in claim 6 wherein the flow rate of $NH_3$ is about 250 sccm.

9. A method as claimed in claim 1 wherein the layer is subject to post deposition plasma treatment.

10. A method as claimed in claim 9 wherein the plasma treatment uses a $H_2/N_2$ or $H_2/N_2$ plasma.

11. A method as claimed in claim 1 wherein the deposition takes place in a chamber at a chamber pressure between 4 and 8 Torr.

12. A method of forming truly amorphous TiN comprising Chemical Vapour Deposition (CVD) of TiN from a silicon-doped titanium containing compound and nitrogen or a nitrogen containing compound, and wherein a silicon content in the TiN is less than 0.5 at. %.

13. A method as claimed in claim 12, wherein the amorphous TiN film is stoichiometric.

14. A method as claimed in claim 1, wherein the amorphous TiN film is stoichiometric.

15. A method as claimed in claim 1, wherein the amorphous TiN film is devoid of crystallites.

16. A method as claimed in claim 12 wherein the silicon to titanium atomic ratio of the silicon-containing TDEAT is in the range 5:95 to 15:85.

17. A method as claimed in claim 13 wherein the silicon to titanium atomic ratio is about 10:90.

* * * * *